United States Patent
Klaren

(10) Patent No.: US 11,539,334 B2
(45) Date of Patent: Dec. 27, 2022

(54) COMPACT ARCHITECTURE FOR MULTIPATH LOW NOISE AMPLIFIER

(71) Applicant: pSemi Corporation, San Diego, CA (US)

(72) Inventor: Jonathan James Klaren, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/200,858

(22) Filed: Mar. 14, 2021

(65) Prior Publication Data

US 2021/0273616 A1 Sep. 2, 2021

Related U.S. Application Data

(63) Continuation of application No. PCT/US2019/051142, filed on Sep. 13, 2019, which is a continuation of application No. 16/135,965, filed on Sep. 19, 2018, now abandoned.

(51) Int. Cl.
*H03F 3/19* (2006.01)
*H03F 3/195* (2006.01)
*H03F 3/68* (2006.01)
*H04B 1/16* (2006.01)

(52) U.S. Cl.
CPC .............. *H03F 3/195* (2013.01); *H03F 3/68* (2013.01); *H04B 1/16* (2013.01); *H03F 2200/213* (2013.01); *H03F 2200/216* (2013.01); *H03F 2200/294* (2013.01); *H03F 2200/429* (2013.01); *H03F 2200/451* (2013.01)

(58) Field of Classification Search
CPC ...... H03F 3/195; H03F 3/68; H03F 2200/213; H03F 2200/216; H03F 2200/294; H03F 2200/429; H03F 2200/451; H04B 1/16
See application file for complete search history.

(56) References Cited

U.S. PATENT DOCUMENTS

| 9,941,849 | B1 | 4/2018 | Ayranci et al. |
| 9,973,149 | B2* | 5/2018 | Ayranci ............ H03F 1/565 |
| 10,110,166 | B1 | 10/2018 | Noori |
| 2004/0080367 | A1* | 4/2004 | Crain ............ H03F 3/45192 |
| | | | 330/253 |

(Continued)

FOREIGN PATENT DOCUMENTS

WO 2020060878 3/2020

OTHER PUBLICATIONS

Shah, et al., "Switchless Multi Input Stacked Transistor Amplifier Tree Structure", application filed in the USPTO dated Dec. 18, 2017, U.S. Appl. No. 15/846,055, 52 pgs.

(Continued)

*Primary Examiner* — Junpeng Chen
(74) *Attorney, Agent, or Firm* — Jaquez Land Greenhaus & McFarland LLP; Alessandro Steinfl, Esq.

(57) ABSTRACT

Methods and devices used in mobile receiver front end to support multiple paths and multiple frequency bands are described. The presented devices and methods provide benefits of scalability, frequency band agility, as well as size reduction by using one low noise amplifier per simultaneous outputs. Based on the disclosed teachings, variable gain amplification of multiband signals is also presented.

24 Claims, 11 Drawing Sheets

(56) References Cited

U.S. PATENT DOCUMENTS

| | | | |
|---|---|---|---|
| 2005/0231290 A1* | 10/2005 | Hung | H03F 3/193 |
| | | | 330/311 |
| 2006/0071712 A1 | 4/2006 | Lee | |
| 2006/0189286 A1 | 8/2006 | Kyu | |
| 2007/0008020 A1* | 1/2007 | Lee | H03F 1/303 |
| | | | 327/112 |
| 2007/0296456 A1* | 12/2007 | van der Goes | H03K 19/0005 |
| | | | 326/30 |
| 2008/0036538 A1* | 2/2008 | Lee | H03F 3/3022 |
| | | | 330/261 |
| 2010/0237947 A1 | 9/2010 | Xiong | |
| 2010/0289531 A1* | 11/2010 | Sudjian | H03K 3/3565 |
| | | | 327/65 |
| 2010/0311378 A1 | 12/2010 | Tasic | |
| 2011/0032035 A1* | 2/2011 | Pletcher | H03F 3/72 |
| | | | 330/277 |
| 2011/0068871 A1* | 3/2011 | Fujimoto | H03F 3/72 |
| | | | 330/277 |
| 2013/0169364 A1* | 7/2013 | Cha | H03F 3/16 |
| | | | 330/296 |
| 2014/0240048 A1* | 8/2014 | Youssef | H03F 3/245 |
| | | | 330/296 |
| 2014/0300417 A1 | 10/2014 | Xu et al. | |
| 2015/0035600 A1 | 2/2015 | Jin et al. | |
| 2016/0173086 A1* | 6/2016 | Chiang | H03K 17/6872 |
| | | | 327/434 |
| 2016/0373062 A1* | 12/2016 | Mittal | H03F 3/245 |
| 2017/0170788 A1 | 6/2017 | Lin et al. | |
| 2017/0187338 A1 | 6/2017 | Wang et al. | |
| 2018/0323756 A1* | 11/2018 | Sun | H03F 1/0261 |
| 2019/0245497 A1* | 8/2019 | Sanner | H03F 3/195 |
| 2020/0091876 A1 | 3/2020 | Klaren et al. | |

OTHER PUBLICATIONS

Wienema, David, International Search Report and Written Opinion received from the EPO dated Dec. 4, 2019 for appln. No. PCT/US2019/051142, 14 pgs.

Tran, Paul P., Office Action received from the USPTO dated Nov. 29, 2020 for U.S. Appl. No. 16/135,956, 27 pgs.

\* cited by examiner

|          |     | LD1 | LD2 | LD3 | LD4 |
|----------|-----|-----|-----|-----|-----|
| 1.5 GHz  | gm1 | x   |     |     |     |
| 1.8 GHz  | gm2 |     | x   | x   |     |
| 2.2 GHz  | gm3 | x   |     |     | x   |
| 2.3 GHz  | gm4 |     | x   |     |     |
| 2.5 GHz  | gm5 | x   | x   | x   | x   |
| 3.5 GHz  | gm6 | x   |     |     |     |

COMPACT ARCHITECTURE FOR MULTIPATH LOW NOISE AMPLIFIER

CROSS-REFERENCE TO RELATED APPLICATIONS

The present application is a continuation of PCT application PCT/US2019/051142 filed on Sep. 13, 2019, entitled "Compact Architecture For Multipath Low Noise Amplifier" which, in turn, is a continuation of U.S. patent application Ser. No. 16/135,965 filed on Sep. 19, 2018, entitled "Compact Architecture For Multipath Low Noise Amplifier" now abandoned, the contents of all of which are herein incorporated by reference in their entirety.

The present application is related to U.S. Pat. No. 9,941,849 issued Apr. 10, 2018, entitled "Programmable Optimized Band switching LNA for Operation in Multiple Narrow-Band Frequency Ranges", application Ser. No. 15/616,824 filed Jun. 7, 2017, entitled "LNA with Variable Gain and Switched Degeneration Inductor", U.S. Pat. No. 9,973,149 issued May 15, 2018, entitled "Source Switched Split LNA", and application Ser. No. 15/846,055 filed Dec. 18, 2017, entitled "Switchless Multi Input Stacked Transistor Amplifier Tree Structure", all incorporated herein by reference in their entirety.

BACKGROUND

Technical Field

The present disclosure is related to low noise amplifiers (LNA), and more particularly to methods and apparatus used in mobile receiver front end to support multiple paths and multiple frequency bands.

Background

Low noise amplifier (LNA) front end circuits for mobile communication continue to increase in complexity requiring support for multiple frequency bands and for multiple amplifier paths active at the same time (carrier aggregation and/or dual connectivity). As an example, in the Long Term Evolution (LTE) standard, carrier aggregation is used to increase the bandwidth. Such carrier aggregation may comprise various operation modes such as intra-band continuous/non-continuous carrier aggregation and inter-band carrier aggregation. As a result, receivers supporting these various modes are needed. At the same time, RF front end suppliers are pushed to make design changes rapidly while reducing device size and cost. In other words, demand for reducing the size and manufacturing costs of mobile communication equipment is ever increasing while miniaturization of such equipment has become an essential design requirement.

SUMMARY

Methods and devices taught in the present disclosure address the challenging and conflicting design requirements described in the previous section. The described methods and devices provide LNA designs allowing for easier modifications of the band inputs and the number of supported outputs. Such methods and devices aim to reduce the device size by essentially using one LNA per simultaneous outputs.

According to a first aspect of the present disclosure, a radio frequency (RF) receiver is provided comprising: a plurality of current gain blocks; and a plurality of output loads; wherein: (i) each current gain block is selectively connected to one or more output loads of the plurality of the output loads; (ii) a current gain block of the plurality of current gain blocks is configured to: receive an input signal; generate one or more amplified signals corresponding to the input signal, and (iii) an output load of the plurality of output loads is configured to receive corresponding one or more amplified signals and to generate corresponding one or more output signals.

According to a second aspect of the present disclosure, a method of amplifying a signal with a spectrum comprising multiple frequency bands is provided comprising: providing one or more current gain blocks; providing one or more output loads; connecting each gain block of the one or more current gain blocks to one or more output loads; amplifying at least one signal corresponding to one or more frequency bands of the multiple frequency bands to generate one or more amplified signals, and driving at least one output loads of the one or more output loads using the one or more amplified signals to generate at least one or more amplified output signals.

According to a third aspect of the present disclosure, a radio frequency (RF) receiver front end is provided comprising: a plurality of band filters corresponding to one or more frequency bands representing an input signal; one or more band switches; one or more current gain blocks connecting each a corresponding band switch of the one or more band switches to one or more output loads; wherein: each band switch is configured to select at least one frequency band filter of the plurality of band filters; a current gain block corresponding to the band switch is configured to selectively tune into the at least one frequency band of the one or more frequency bands; the at least one frequency band filter of the one or more frequency band filters receives the input signal to generate a filtered signal; the current gain block is configured to receive the filtered signal to generate one or more amplified signals; and the one or more output loads are configured to receive the one or more amplified signals and to generate corresponding one or more output signals.

DESCRIPTION OF THE DRAWINGS

FIG. 3 shows correspondence of frequencies and output load supported by various current gain blocks of a receiver front end.

DETAILED DESCRIPTION

Definitions

The term "current gain block" is referred herewith to an electronic circuit that amplifies an input signal thereby generating current to drive an output load.

The term "folded architecture" is referred herewith to an LNA architecture using a combination of negative metal oxide (NMOS) and positive metal oxide (PMOS) transistors in current gain and load stages to provide support for smaller available power supply voltage headroom imposed by design requirements.

DESCRIPTION

Methods and devices in accordance with the present disclosure are presented, providing LNA designs allowing for easier modifications of the band inputs and the number of supported outputs. Such methods and devices:
- offer band agility, covering as many bands as possible with one LNA
- aim toward size reduction by using one LNA per simultaneous outputs
- support step-variable gain for low Noise Figure (NF) in high gain states and high linearity in low gain states.

Figure 1:
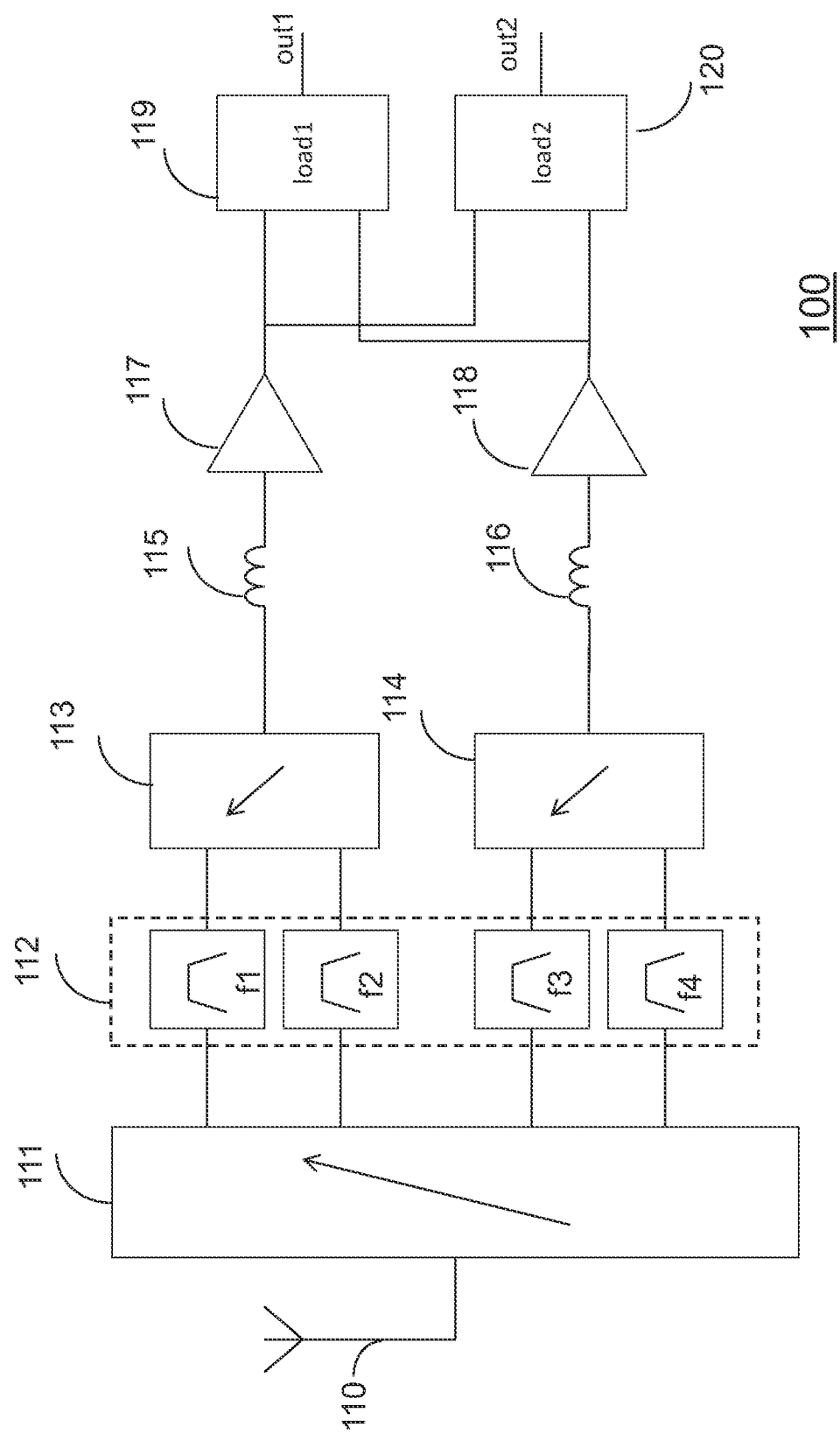
FIG. 1 shows a receiver front end according to an embodiment of the present disclosure.

FIG. 1 shows a receiver front end (100) according to an embodiment of the present disclosure. The receiver front end (100) comprises an antenna (110) connected to a plurality of band filters (112) through antenna switch (111). The plurality of band filters (112) correspond to bands (for example, f1, ..., f4). The receiver front end (100) further comprises two band switches (113, 114) connected to their corresponding current gain blocks (117, 118) via coupling inductors (115, 116) respectively. According to an embodiment of the present disclosure, current gain blocks (117, 118) may each be configured to drive two loads (119, 120) simultaneously and therefore generate output signals at outputs (out1, out2). Current gain block (117) may be configured to support either of frequency bands (f1, f2) and similarly, current gain block (118) may be configured to support either of frequency bands (B3, B4). Therefore, receiver front end (100) may support four input bands and two output loads. By way of example, and depending on design requirements, current blocks (117, 118) may be tuned to support frequency bands (f1, f3) respectively. In the same embodiment, band switches (113, 114) may be configured to select frequency bands (f1, f3) respectively. The person skilled in the art will appreciate that, depending on design requirements, no major change in the design of the current gain blocks will be required except for shifting to the desired frequency band and this will allow accommodating various design requirements without going through long design cycles. With further reference to FIG. 1, the person skilled in the art will also understand that a combination of, for example, current gain block (117) with each of the loads (119, 120) may be seen as separate LNA's. By virtue of separating the current gain block and the loads, a reuse of the same current gain block simultaneously with multiple output loads has been made possible, resulting in a reduced foot print to address stringent size reduction requirements as described previously. With further reference to FIG. 1, the person skilled in the art will understand that, without departing from the scope and the spirit of the invention, embodiments may be made supporting an arbitrary number of frequency bands, and using arbitrary numbers of current gain blocks and output loads.

Figure 2:
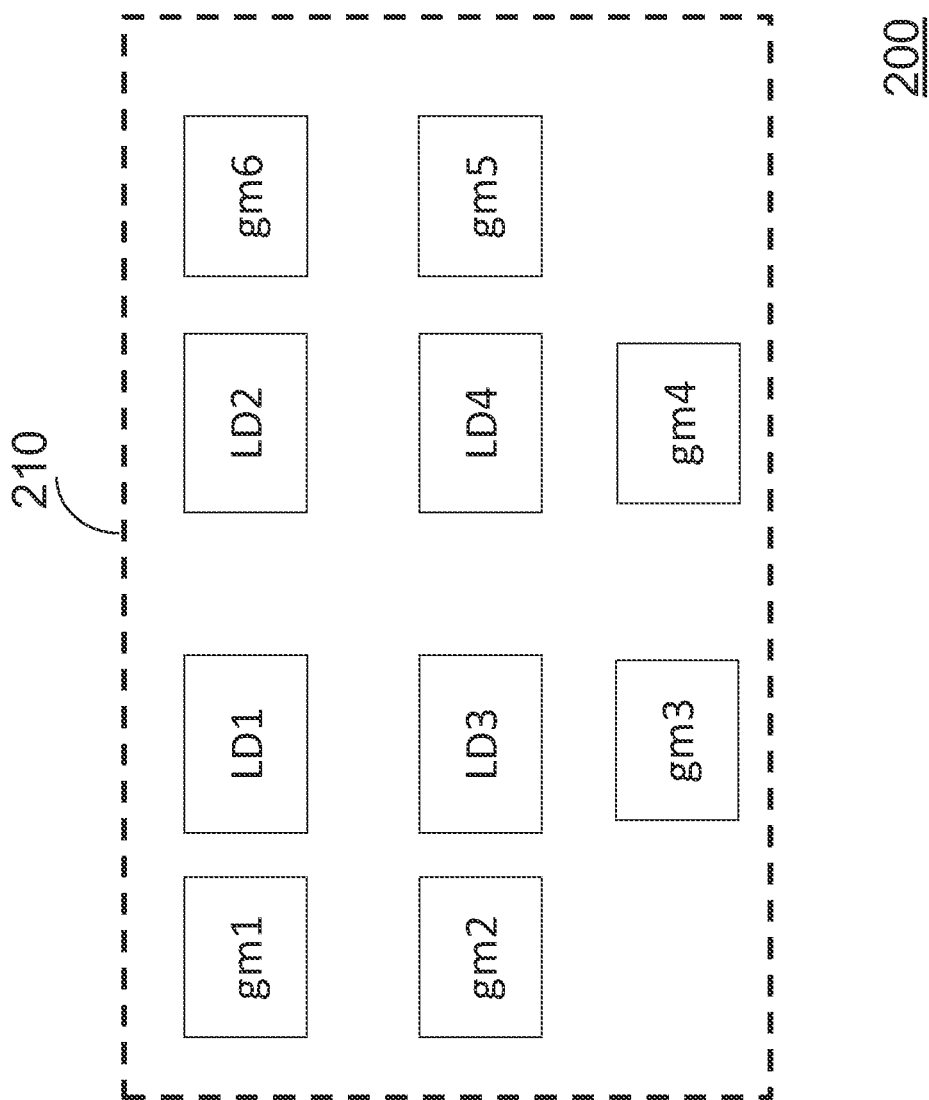
FIG. 2 shows how different elements of a receiver front end may be laid out on a same chip or die in accordance with the present disclosure.

FIG. 2 shows a diagram (200) of an RF receiver front end (210) showing how the current gain blocks and output loads may be laid out on a same chip or die in accordance with an embodiment of the disclosure. This is a simplified diagram wherein details of how various elements are interconnected are not shown to avoid overwhelming the diagram with interconnection details. As shown in FIG. 2, the RF receiver front end (210) comprises a plurality of current gain blocks (gm1, ..., gm6) and output loads (LD1, ..., LD4). In other words, the embodiment shown in FIG. 2, supports 6 LNA inputs (each LNA input can support multiple sub-band inputs, defined by corresponding filters, where the multiple sub-band inputs can be combined together by a switch or other method) and 4 outputs. Similarly to what was described with regards to receiver front end (100) of FIG. 1, current gain stages (gm1, ..., gm6) may be configurable to tune to various frequency bands. Moreover, in accordance with further embodiments of the present disclosure, and depending on the application requirements, each of current gain blocks (gm1, ..., gm6) may be connected to one or more of output loads (LD1, ..., LD4). This provides benefits of flexibility, scalability and reusability of the receiver front end (210) for different applications imposing distinctive requirements. In other words, a generic floor plan is provided wherein by implementing minor changes and/or customization to one or more current gain stages and related interconnections to the loads, the frond end receiver (210) may be adapted to new applications/requirements without having to go through a new full design cycle of such a receiver front end. To further clarify this point, reference is made to table (300) of FIG. 3 showing frequency coverage of current gain blocks (gm1, ..., gm6) of FIG. 2. Table (300) also shows which output load, each of the current gain blocks (gm1, ..., gm6) are connected to. For example, current gain block (gm5) is configured to support a frequency band including 2.5 GHz and to connect to output loads (LD1, ..., LD4). Continuing with the same example, the person skilled in the art will appreciate that current gain block (gm2) may be designed to be reconfigurable (programmed on the fly) to support multiple frequency bands. Additionally, designs having distinct gm blocks per band may also be envisaged in accordance with embodiments of the present disclosure. For this example, and based on the application requirement, current gain block (gm5) is tuned to a frequency band including the center frequency of 2.5 GHz. As another example, current gain block (gm1) may be configured to support a frequency band including the center frequency of 1.5 GHz and to connect to output loads (LD1, LD2, LD3) simultaneously. In view of the above, embodiments may be envisaged in accordance with the present disclosure, wherein a plurality of input frequency bands are supported, and each current gain block may drive one or more output loads simultaneously. In other words, by virtue of the current gain blocks and output loads being separate and independent, scalable designs with the capability of supporting various frequency bands is made possible by the teachings of the present disclosure.

With further reference to FIGS. 2-3, the person skilled in the art will appreciate that, after performing some adjustments/customization, the receiver front end (200), after being laid out as shown in FIG. 2, may be reused for different applications that have similar form factor requirements. By way of example, and with reference to table (300) of FIG. 3, if a new application does not require a connection of current gain (gm3) to output load (load2), a customization, including disconnection of related metals and tying them off to ground, can be implemented to erase such connection and therefore to adapt the receiver front end (200) of FIG. 2 to the new application. The person skilled in the art will understand that such customization is easier and more straightforward to implement compared to a full redesign of the whole receiver front end. Moreover, the layout may be designed such that base layers are configured to support a range of match component sizes and to support various frequency bands. In view of this, the teachings of the present disclosure provide design flexibility, by decreasing time and effort to add/remove band inputs and simultaneous outputs.

With further reference to FIG. 3, and according to some embodiments of the present disclosure, output loads (LD1, . . . , LD4) are tunable to support a frequency band including a combination of frequency bands supported by corresponding current gain blocks. According to further embodiments of the present disclosure, one or more of the current gain blocks connected with a particular output load may be inactive while the other current gain blocks connected with the particular output load are active. More in particular, and according to other embodiments of the present disclosure, the current gain blocks connected to a particular load are only active one at a time. As an example, and referring to FIG. 3, current gain blocks (gm1, . . . , gm5) are connected to load LD2. In operative conditions, current gain block (gm1) drives load (LD1), while other current gain blocks (gm2, . . . , gm5) may be inactive/OFF, meaning no current is driven to load (LD1) by current gain blocks (gm2, . . . , gm5). According to further embodiments of the present disclosure, multiple loads may be active at a time, each with one active and operating gain block.

Figure 4:
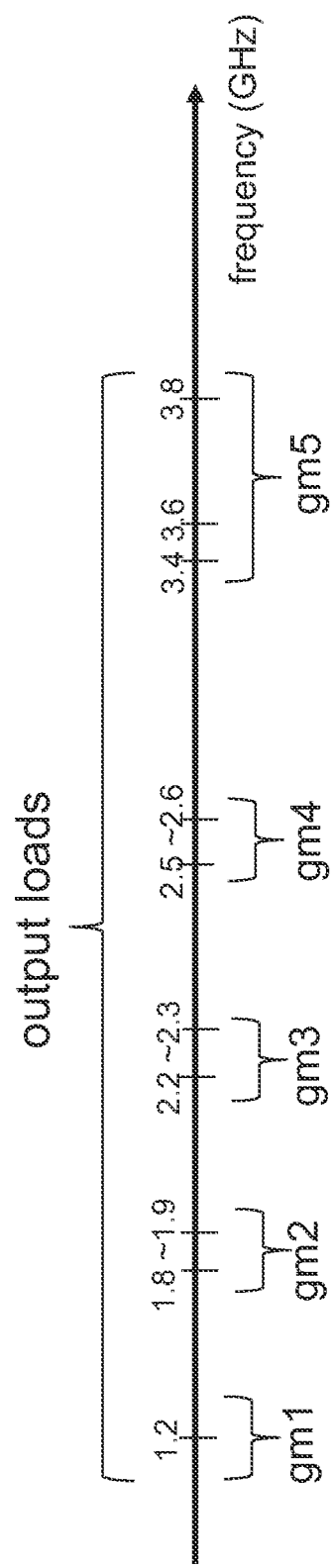
FIG. 4 shows some exemplary frequency bands.

FIG. 4 shows an example of frequency bands that may be supported by a receiver front end in accordance with embodiments of the present disclosure. As shown in FIG. 4, current gain blocks (gm1, . . . , gm5) may be tuned respectively to 1.2 GHz, 1.8 to 1.9 GHz, 2.2 to 2.3 GHz, 2.5-2.6 GHz and 3.5-3.8 GHz. According to further embodiments of the disclosure, any output load connected with current gain blocks (gm1, . . . , gm5) may be designed to support broader frequency bands compared with of current gain block. As an example, and with further reference to FIG. 4, an output load may be designed to support the range 1.2 GHz~3.8 GHz.

Figure 5A:
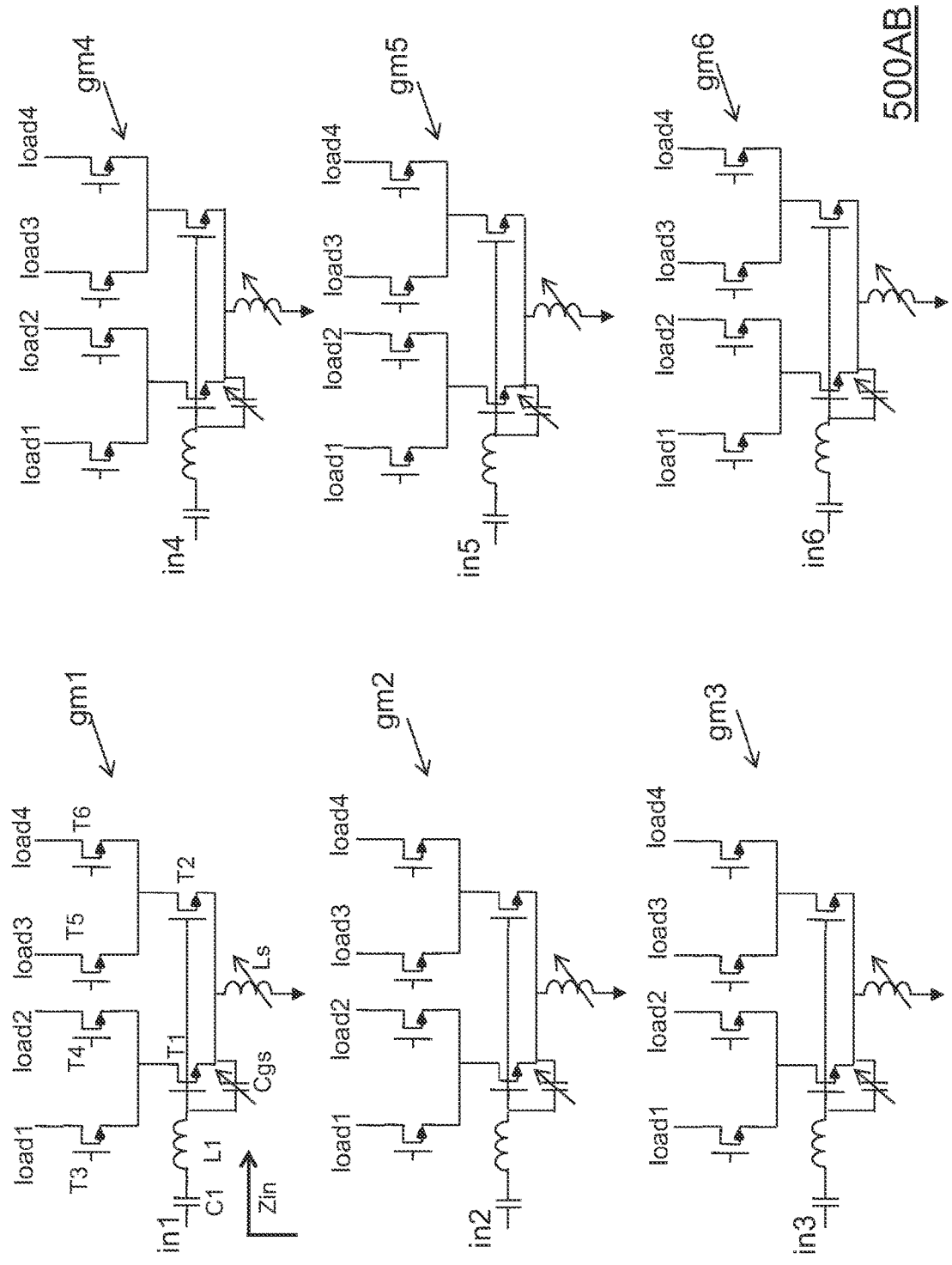
FIGS. 5A-5B show a receiver input stage.
Figure 5B:
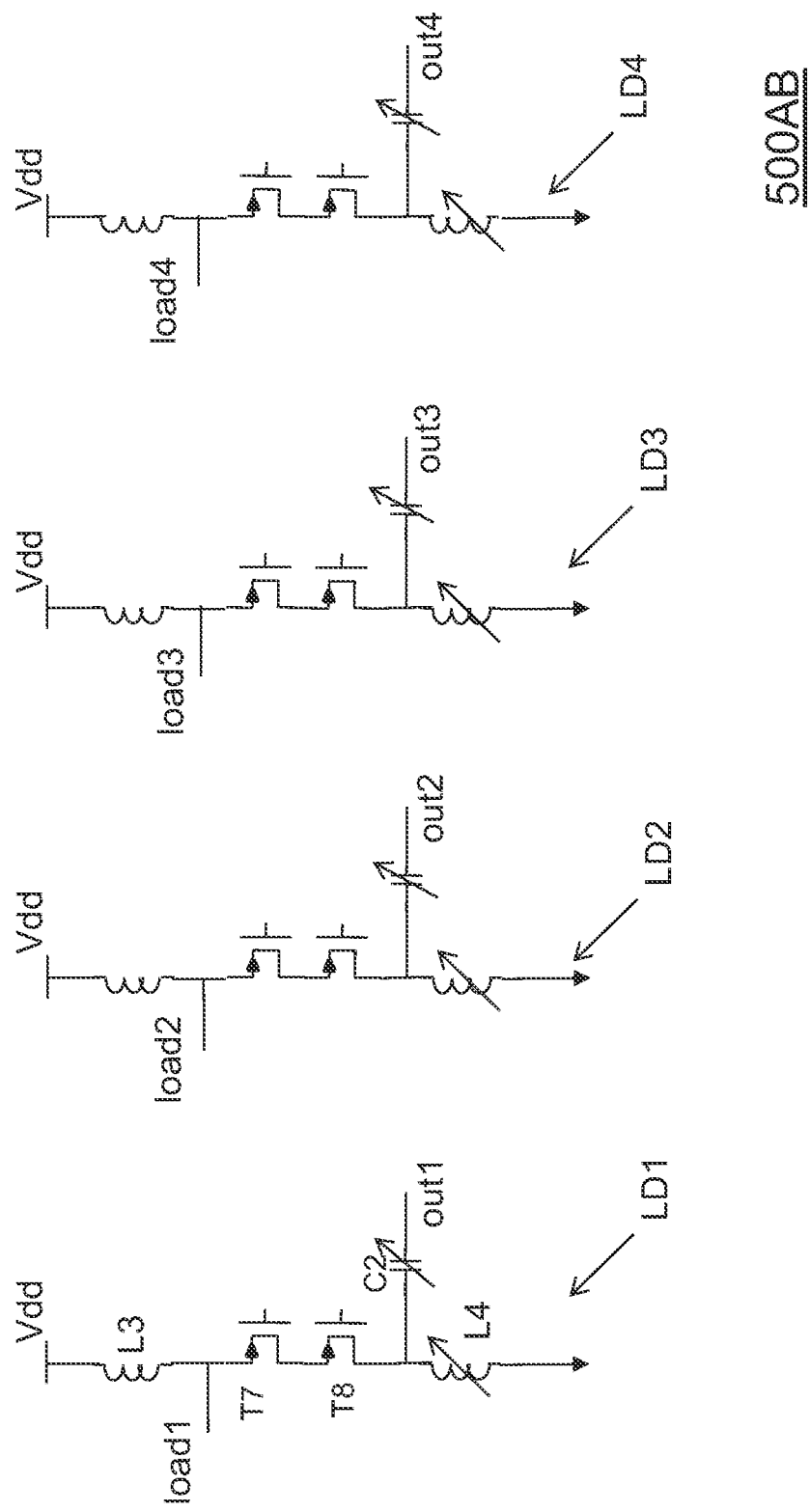

A combination of FIGS. 5A-5B shows a receiver input stage (500AB) comprising current gain blocks (gm1, . . . , gm6)(FIG. 5A) and output loads (LD1, . . . , LD4)(FIG. 5B). Current gain blocks (gm1, . . . , gm6) receives input signals from their corresponding input terminals (in1, . . . , in6). As shown in FIG. 5A, each of current gain blocks (gm1, . . . , gm6) may be connected to any of output loads (LD1, . . . , LD4) through connection points (load1, . . . , load4). As an example, the connection point load1 (of FIG. 5A) of the current gain block gm2 is connected to the connection point load1 (of FIG. 5B) of the output load LD1. In other words, the receiver input stage (500A) may receive six different inputs from terminals (in1, . . . , in6) and each of current gain blocks (gm1, . . . , gm6) may drive one or more of output loads (LD1, . . . , LD4)(FIG. 5B 500B) simultaneously, to provide output signals at output terminals (out1, . . . , out4). Reference is made to FIG. 2 of application Ser. No. 15/846, 055 filed Dec. 18, 2017, entitled "Switchless Multi Input Stacked Transistor Amplifier Tree Structure", incorporated herein by reference in its entirety, showing a split LNA, wherein the cascosde split may be applied to each of current gain blocks (gm1, . . . , gm6) of FIG. 5A, thereby letting the output connect to one of output loads (LD1, . . . , LD4) or two of such output loads if the current gain blocks are connected using the switch (235) of FIG. 2 of the above-incorporated reference.

With reference to FIG. 5A, current gain blocks (gm1, . . . , gm6) have similar functionalities and operate based on a similar concept, although corresponding constituents of each current gain block may be different from a size and/or performance parameters stand point. For the sake of clarity and in order to avoid overwhelming the diagrams, numerals corresponding to constituent elements of only one of the current gain blocks (e.g. gm1) are shown in FIG. 5A. Similarly, and making reference to FIG. 5B, output loads (LD1, . . . , LD4) operate based on the same concept and have similar functionalities. Therefore, numerals corresponding to constituent elements of output load (LD1) only is shown in FIG. 5B for the sake of clarity and ease of read. According to embodiments of the present disclosure, and similarly to what described with regards to current gain blocks (gm1, . . . , gm6) of FIG. 5A, corresponding constituent elements of each of output loads (LD1, . . . , LD4) may be different from one another, with reference, for example to size, performance parameters, type (for example inductance vs. capacitance), or whether or not they are present. Moreover, an embodiment may also be designed wherein constituents of each of the output loads may comprise one or more inductances or capacitances or a combination thereof.

With reference to current gain block (gm1) of FIG. 5A, an input signal is coupled to gain transistors (T1, T2) through coupling capacitance C1 and coupling inductance L1. Current gain block (gm1) comprises two pairs of cascode transistors (T3, T4) and (T5, T6) with respect to the gain transistors (T1,T2). Cascode transistors (T3, T4) have their sources coupled with a drain of corresponding gain transistor T1 and their drains to corresponding output loads (LD1, LD2) of FIG. 5B at connection points (load1, load2). Similarly, sources of cascode pair (T5, T6) are connected to a drain of corresponding gain transistor (T2) and drains of the cascode pair (T5, T6) are connected to output loads (LD3, LD4) of FIG. 5B at the connection points (load3, load4). Current gain block (gm1) further comprises a variable capacitor (Cgs) and a variable inductor (Ls), a combination of which is used for tuning purposes to optimize RF performance. According to embodiments of the present disclosure, current gain stages (gm1, . . . , gm6) may be built using the same or different constituents. By way of example, corresponding transistors from one current gain block to another, may have same or different sizes. In accordance with further embodiments of the present disclosure, a bias voltage (not shown in FIG. 5A) is provided to gates of each of the cascode transistors (T3, T4) and (T5, T6). The bias voltage values applied to the gates of the cascode transistors (T3, . . . , T6) may all be the same or different from one another depending on the requirements. During operative conditions and depending on the bias voltage values one or more of cascode transistors (T3, . . . , T6) may be inactive/OFF thus not driving any current to corresponding output loads. More in particular, when a current gain block is connected to a particular load through one of the cascode transistors, the bias voltages of other cascode transistors are such that no other input is going to that particular load. To further clarify this point, and with reference to FIG. 5A, when current gain block (gm1) is active and providing current to output load1 (LD1), no other input is provided through current gain blocks (gm2, . . . , gm6) to output load1 (LD1). This is implemented by adjusting bias voltage values of gates of cascode transistors (T3) of current gain blocks (gm2, . . . , gm6). In other words, only one of the current gain blocks is connected to a selected output load through a corresponding cascode transistor.

With continued reference to FIG. 5A, and similarly to what is described with regards to embodiments of FIGS. 1-2, current gain blocks (gm1, . . . , gm6) may be designed to be tunable to one or more frequency bands. Depending on a specific application requirement, each current gain block (gm1, . . . , gm6) may be selected to be to tuned to a specific frequency band and tuned away from one of the multiple frequency bands each block can be tuned to. An input impedance (Zin) of current gain block (gm1) of FIG. 5A may be calculated according to:

$$\text{Re}(Z_{in}) = \frac{\omega L_s}{C_{gs}}$$

where the term "Re" represents the real part and ω is an angular frequency. The above-mentioned formula may be used to set a desired gain and impedance adapted for a given frequency band. As mentioned previously, each current gain block (gm1, . . . , gm6) may be designed to have various states corresponding to various frequency bands. Depending on the receiver requirement, one of such frequency bands may be chosen to be tuned into. For a different application, different parameter values may be used to support a potentially new and different frequency band.

Figure 5C:
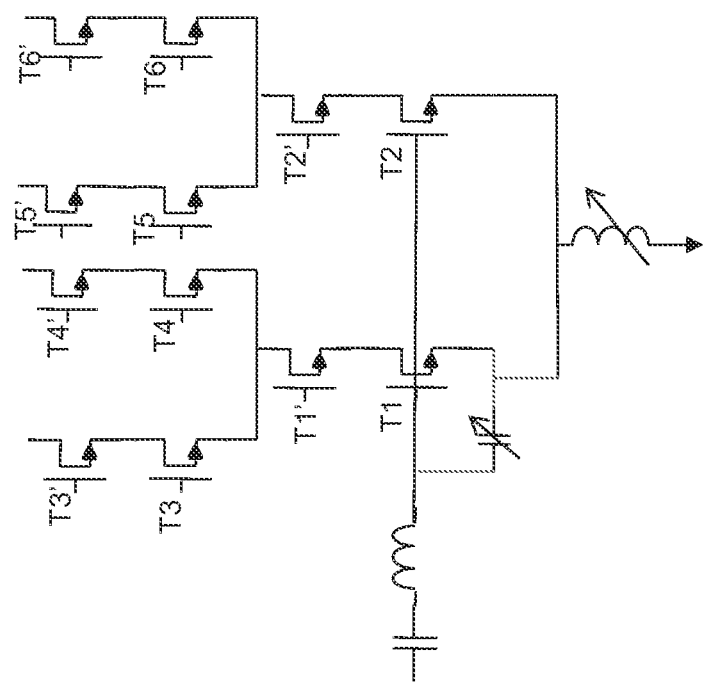
FIG. 5C shows an exemplary current gain block using stacked transistors.

Referring to FIG. 5B, output load (LD1) comprises two stacked transistors (T7, T8), an RF choke (L3) connecting a supply voltage (Vdd) to a source of the transistor (T7), and a variable inductor (L4) and a variable capacitor (C2), a combination of which is used to tune the output load (LD1) to desired frequency bands. A first end of the variable inductor (L4) is connected to the variable capacitor (C2) and to a drain of the transistor (T8), while a second end of the variable inductor (L4) may be connected to a reference voltage or ground. In accordance with an embodiment of the present disclosure, transistors (T1, . . . , T6) of FIG. 5A are NMOS transistors and transistors (T7, T8) are PMOS transistors. According to an embodiment of the present disclosure, RF choke (L3) is used to drive current and has negligible impact on the design for desired frequency bands. As such, RF choke (L3) may be made sufficiently large with metallization so that its shunt impedance does not affect the load impedance. Moreover, according to embodiments of the present disclosure the RF choke (L3) may be a current source or an element exhibiting high impedance at the RF frequency. With further reference to FIG. 5A, and without departing from the spirit and scope of the invention, embodiments in accordance with the present disclosure may be envisaged wherein each of transistors (T1, . . . , T6) comprises a plurality of stacked transistors. FIG. 5C shows a current gain block (500C) to illustrate such embodiments. In other words, each pair of transistor pairs (T1, T1'), . . . , (T6, T6') represents stacked transistors.

Figure 5D:
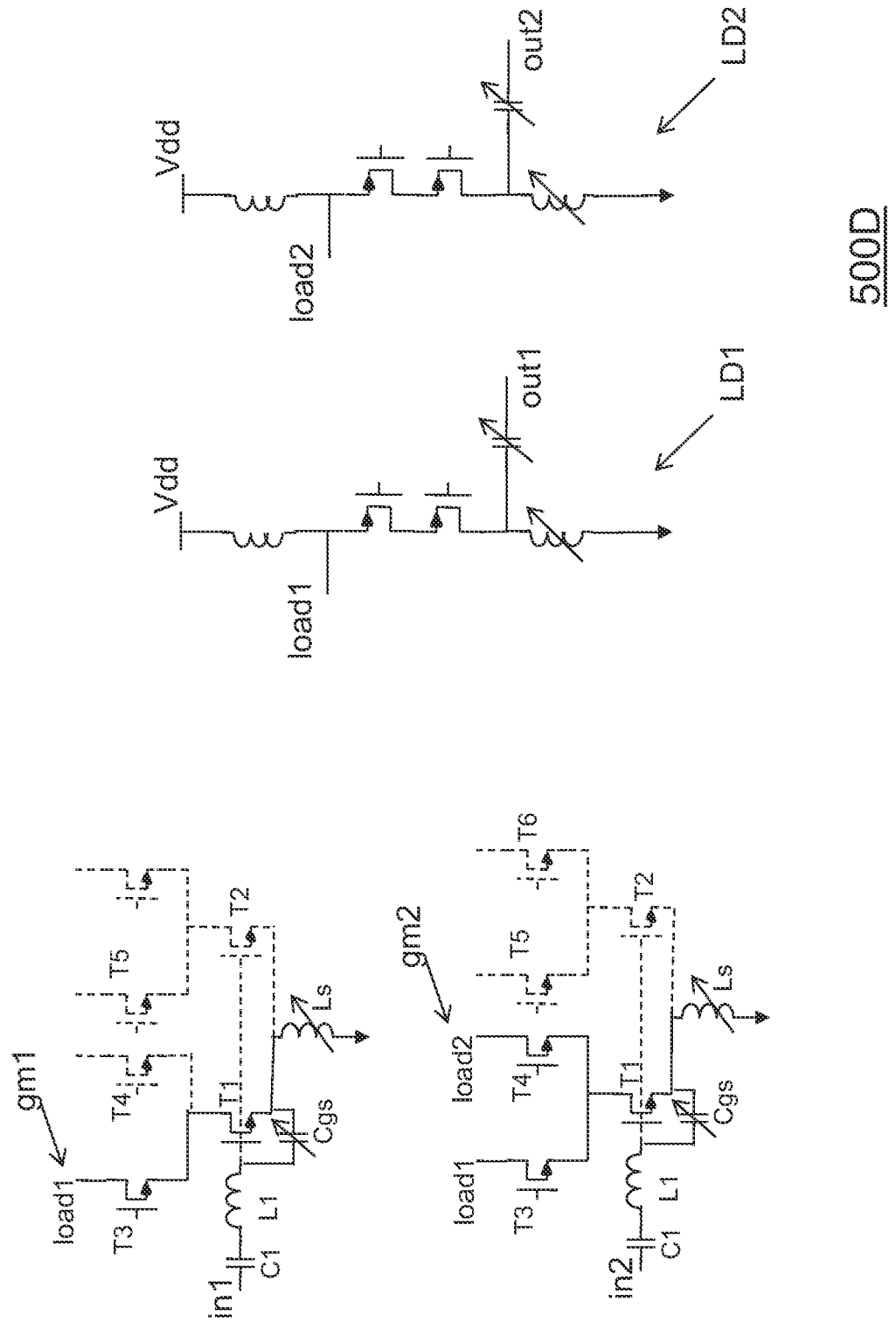
FIG. 5D shows an exemplary receiver front end according to embodiments of the present disclosure.

Referring back to FIG. 5A, the person skilled in the art will appreciate that further embodiment in accordance with the present disclosure with one or more inputs, one or more outputs and supporting one or more frequency bands may be designed. To further illustrate this, FIG. 5D shows an exemplary receiver front end (500D) with two inputs (in1, in2) and two outputs (out1, out2). The receiver front end (500D) further comprises current gain stages (gm1, gm2) connected to output loads (LD1, LD2) via connections points (load1, load2). As shown in FIG. 5D, current gain stage (gm1) may be used to drive one load (e.g. LD1) while current gain stage (gm2) may be used to drive two loads (LD1, LD2), simultaneously or only one. According to an embodiment of the present disclosure, current gain stages (gm1, gm2) may each be designed to be tunable to one or more arbitrary frequency bands. Continuing with the same example, portions of the schematic representing current gain stages (gm1, gm2) of FIG. 5D are shown in dotted lines. This is to compare the current gains (gm1, gm2) of FIG. 5D with their counterparts in FIG. 5A and to show the portions of the current gains of FIG. 5A that have been removed to design current gains (gm1, gm2) of FIG. 5D.

Figure 6B:
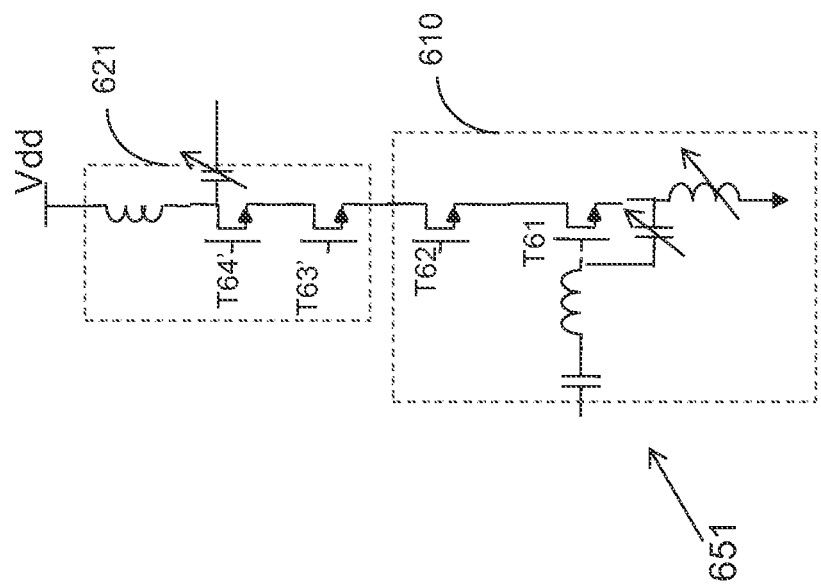
FIG. 6B shows an exemplary LNA architecture according to further embodiments of the present disclosure.
Figure 6A:
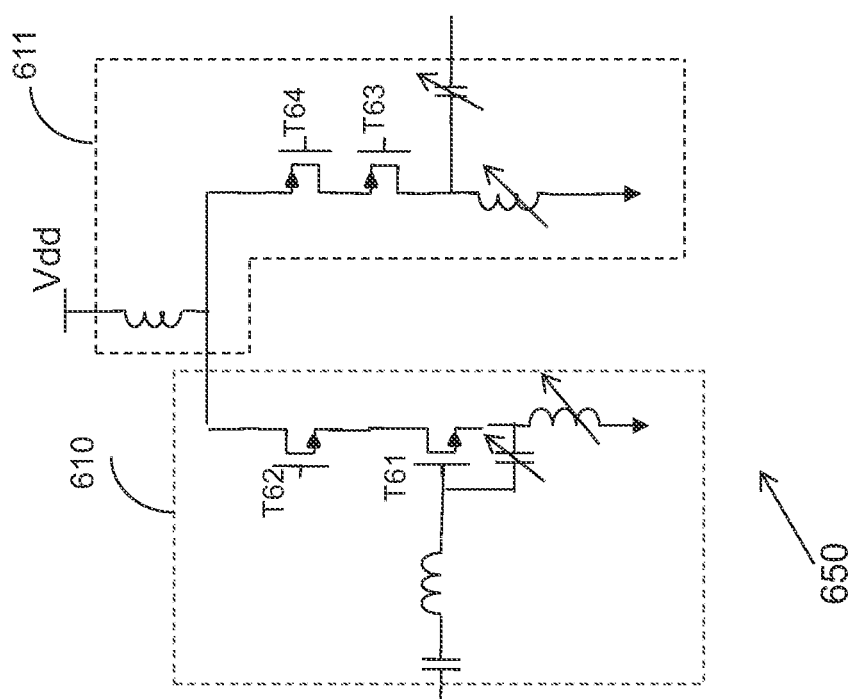
FIG. 6A shows an exemplary LNA architecture according to embodiments of the present disclosure.

FIG. 6A shows an LNA (650) comprising a current gain block (610) and an output load (611) in accordance with an embodiment of the present disclosure. Making further reference to FIGS. 5A-5B, and in view of what described with regards to receiver input stage (500A & 500B), the LNA (650) represents essentially a combination of any of current gain blocks (gm1, . . . , gm6) of receiver input stage (500A) with any of output loads (LD1, . . . , LD4) of the receiver input stage (500B). According to an embodiment of the present disclosure, transistor (T61, T62) are NMOS transistors and transistors (T64, T63) are PMOS transistors. The person skilled in art will appreciate that LNA (650) has a folded architecture allowing to accommodate possible stringent voltage headroom requirements. By virtue of using different transistor types for transistor pairs (T61, T62) and (T63, T64), design requirements imposing smaller available voltage headroom may be supported. According to embodiments of the present disclosure, the output load (611) may comprises one or more cascode transistors.

FIG. 6B shows an LNA (651) in accordance with a further embodiment of the present disclosure. Similar to the LNA (650) of FIG. 6A, LNA (651) comprises the current gain block (610). The LNA (651) further comprises an output load (621) comprising a transistor pair (T63', T64') arranged in a stack configuration. According to an embodiment of the present disclosure, transistors (T63', T64') are NMOS transistors. According to embodiments of the present disclosure, the output load (621) may comprise one or more cascode transistors.

Figure 7:
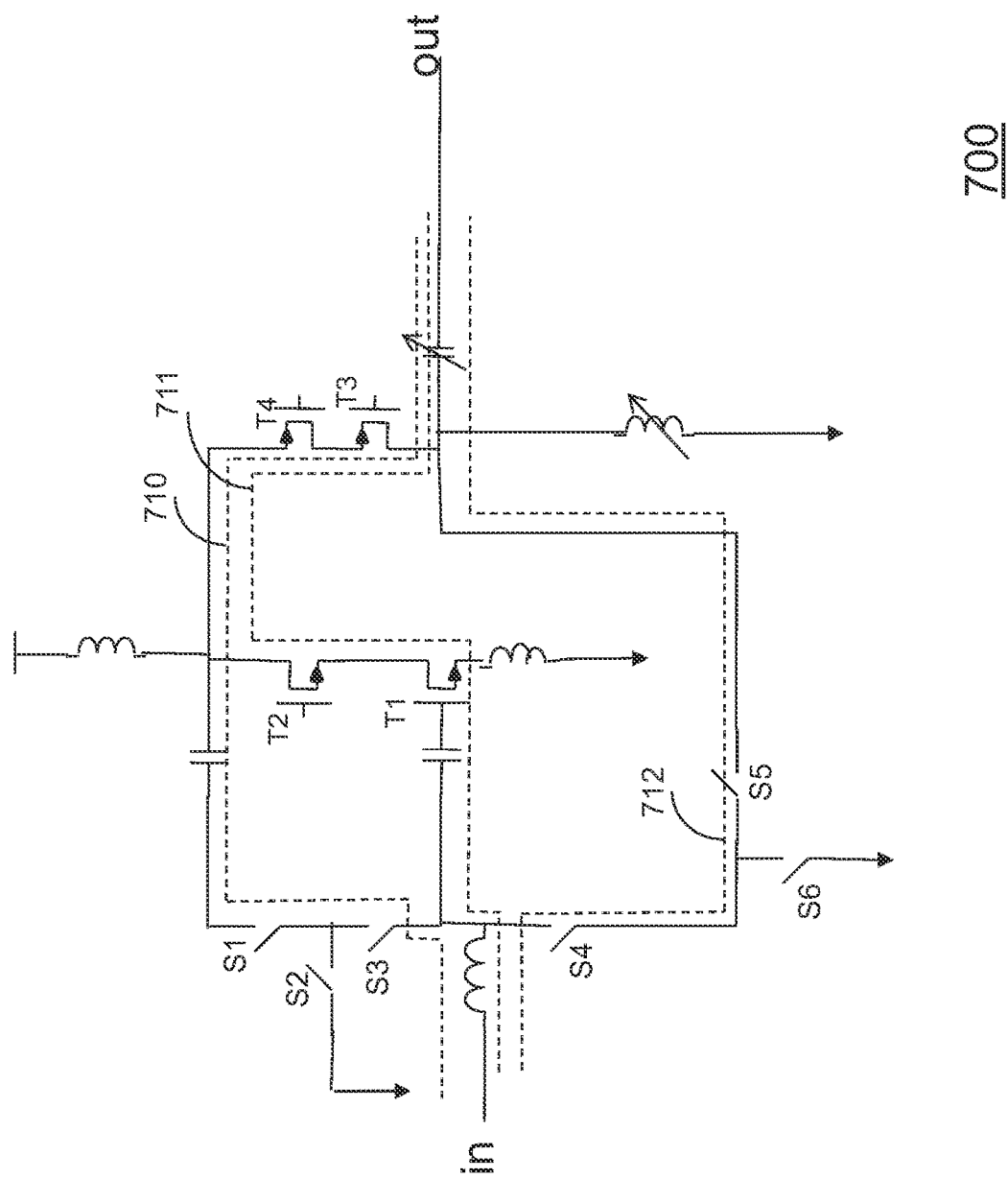
FIG. 7 shows an exemplary LNA architecture with three different gain states.

As described previously, the teachings of the present disclosure provide methods and devices for supporting step-variable gain for low Noise Figure (NF) in high gain states and high linearity in low gain states. FIG. 7 shows an LNA (700) in accordance with embodiments of the present disclosure, operating in three different gain states: high gain, medium gain and low gain states. The principle of operation of LNA (700) is similar to what is described before with regards to the LNA (650) of FIG. 6A. LNA (700) further comprises switches (S1, . . . , S6), states of which will indicate what gain state is LNA (700) configured to operate in. FIG. 7 shows three different signal paths (710, 711, 712) of an input signal travelling from an input terminal (in) to an output terminal (out). When LNA (700) is in the medium gain state, switches (S1, S3) are closed and all other switches are open. The input signal coming in from the input terminal (in) will travel path (710) to output terminal (out). In other words, in the medium gain state, transistors (T1, T2) are bypassed and the input signal experience gain through a common gate configuration based on transistors (T3, T4). Signal path (711) corresponds to the high gain state. In such state, switches (S2, S6) are closed and all other switches are open. As a result, the input signal experience gain first by passing through transistors (T1, T2) being configured in common source, and then by passing through transistors (T3, T4) configured as common gate. When in the low gain state, switches (S4, S5) are closed and all other switches are open. In this state, which corresponds to signal path (712), all transistors are bypassed and the input signal experiences practically no gain while travelling from input terminal (in) to output terminal (out). The person skilled in art will understand that switches (S2, S6) are optional and mainly used for isolation purposes. In other words, switches (S2) or (S6) are closed when their corresponding pair of switches (S1, S3) or (S4, S5) are open. Moreover, embodiments with only series switches and without switches (S2, S3, S4, S6) in accordance with the present disclosure may be designed. According to further embodiments of the present disclosure, the switch network, may be configured according to desired isolation requirements.

Figure 8:
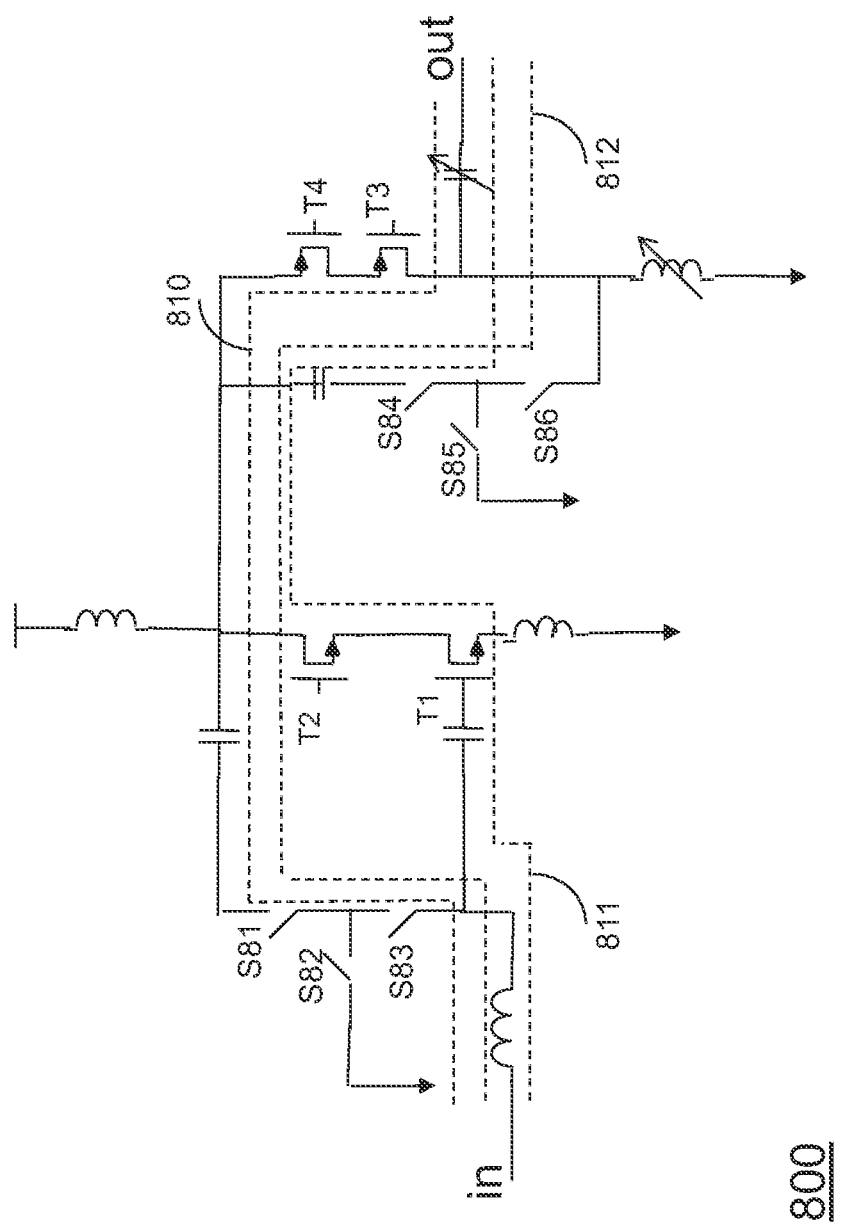
FIG. 8 shows an exemplary LNA architecture with three different gain states.

FIG. 8 shows an LNA (800) designed to operate in a first, a second and a third gain state. The principle of operation of LNA (800) is based on similar concept as to what described with regards to LNA (700) of FIG. 7. LNA (800) comprises switches (S81, . . . , S86). In the first gain state, switches (S81, S83) are closed and all other switches are open. As a result, transistors (T1, T2) are bypassed and an input signal traveling from an input terminal (in) to an output terminal (out) will experience a first gain state by passing through transistors (T3, T4) which are configured in common gate. In the second gain state, switches (S84, S86) are closed and all other switches are open. As a result, transistors (T3, T4) are bypassed and the input signal traveling from the input terminal to the output terminal will experience a second gain state by passing through transistors (T1, T2) which are configured in common source. In the third gain state, switches (S81, S83, S84, S86) are closed and switches (S82, S85) are open. As a result, all transistors (T1, T2, T3, T4) are by passed. The first, the second and the third gain states corresponds respectively to the signal paths (810, 811, 812) shown in dotted lines in FIG. 8. The common source and common gate configurations as explained above may be used to support two different gains depending on design requirements. The person skilled in art will understand that switches (S82, S85) are optional and mainly used for isolation purposes. In other words, switches (S82) or (S85) are closed when their corresponding pair of switches (S81, S83) or (S84, S86) are open. With reference to FIGS. 7-8, embodiments in accordance with the present disclosures may be designed to support a number of one or more gain states using a number of one or more switches. With reference to FIG. 8, the person skilled in the art will appreciate that, there is only one connection point between the current gain stage (including transistors (T1, T2)) and the load section (including transistors (T3, T4)). This allows a more modular approach compared to, for example, the design as shown in FIG. 7, resulting in a simpler layout configuration. By way of example, in a design comprising several current gain stages and several loads, an easier layout configuration is made possible as only one connection is required to be made between each current gain stage and each load compared to designs wherein more than one connection would be required to connect each current gain stage to each corresponding load.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) amplifier comprising:
  a plurality of first stage amplifiers comprising at least one gain transistor of a first type and an input matching network;
  a plurality of second stage amplifiers comprising at least one transistor of a second type with an output matching network; the plurality of second stage amplifiers being connectable to a corresponding plurality of output loads;
  a common power supply node coupled to the plurality of first stage amplifier and the second stage amplifier, and
  a common ground node coupled to the first stage amplifier and the second stage amplifier,
  wherein the RF amplifier has a folded architecture and the RF amplifier is configured to:
    receive an input RF signal;
    amplify the input RF signal by a combination of a first stage amplifier of the plurality of first stage amplifiers and a second stage amplifier of the plurality of second stage amplifiers to generate an amplified signal; and
    feed the amplified signal to an output load at an output RF terminal,
  and wherein the RF amplifier is further configured so that two or more output loads are able to receive amplified signals from the first stage amplifier at the same time.

2. The RF amplifier of claim 1, further comprising a switching module configured to selectively bypass the first stage amplifier and/or the second stage amplifier.

3. The RF amplifier of claim 1, wherein the first type is N-type metal-oxide-semiconductor (NMOS) and the second type is P-type metal-oxide-semiconductor (PMOS).

4. The RF amplifier of claim 1, wherein the first stage amplifier and/or the second stage amplifier comprise cascode amplifiers.

5. The RF amplifier of claim 1, wherein the input matching network and/or the output matching network are a reconfigurable matching network.

6. The RF amplifier of claim 1, wherein:
  the common power supply node is coupled to a voltage source through an RF choke;
  the first stage amplifier is biased at a full voltage of the voltage source, and
  the second stage amplifier is biased at the full voltage of the voltage source.

7. An integrated circuit comprising a plurality of RF amplifiers of claim 1.

8. The integrated circuit of claim 7, wherein the plurality of amplifiers are selectively interconnected to one another.

9. The integrated circuit of claim 8 configured to tune to different frequency bands.

10. The RF amplifier of claim 1, wherein:
  the first stage amplifier further comprises one or more first transistors in a cascode configuration, and a first variable capacitor coupled across gate and source of a first transistor of the one or more first transistors, and the one or more transistors are coupled to the common power supply node.

11. The RF amplifier of claim 10, further comprising a first variable inductor coupling the first transistor of the one or more first transistors to the common ground node.

12. The RF amplifier of claim 11, wherein a combination of the first variable capacitor and the first variable inductor is configured to tune the first stage amplifier to one or more frequency bands.

13. The RF amplifier of claim 12, wherein the combination of the first variable capacitor and the first variable inductor is further configured to set a desired gain and impedance in correspondence with a desired frequency band of the one or more frequency bands.

14. The RF amplifier of claim 10, further comprising:
one or more second transistors in a cascode configuration;
a second variable capacitor coupling the second stage amplifier to the output RF terminal, and
a second variable inductor coupling the one or more second transistors to the common ground node.

15. The RF amplifier of claim 14, wherein a combination of the second variable inductor and the second variable capacitor is configured to tune an input and/or an output of the RF amplifier.

16. The RF amplifier of claim 15 configured to receive bias voltages via gates of the one or more first transistors.

17. The RF amplifier of claim 16, wherein the one or more first transistors are configured to be in ON or OFF state in correspondence with applied bias voltages.

18. The integrated circuit of claim 7, wherein each RF amplifier of the plurality of RF amplifiers is configured to tune to a corresponding frequency band of a plurality of frequency bands, each frequency band of the plurality of frequency bands being different from any other frequency band of the plurality of frequency bands.

19. A folded architecture RF amplifier that receives an input RF signal, amplifies the input RF signal, generates an amplified signal, and feeds the amplified signal to an output load at an output RF terminal, the RF amplifier comprising:
a first stage amplifier comprising at least one gain transistor of a first type and an input matching network;
a second stage amplifier comprising at least one transistor of a second type with an output matching network;
a common power supply node coupled to the first stage amplifier and the second stage amplifier;
a common ground node coupled to the first stage amplifier and the second stage amplifier; and
a switching module configured to selectively bypass the first stage amplifier and/or the second stage amplifier;

wherein:
in a first gain state, the switching module is configured to bypass the first stage amplifier, thereby creating a first signal path from the input RF terminal to the output RF terminal through the second stage amplifier;
in a second gain state, the switching module is configured to bypass the second stage amplifier, thereby creating a second signal path from the input RF terminal to the output RF terminal through the first stage amplifier;
in a third gain state, the switching module is configured to bypass the first stage amplifier and the second stage amplifier, thereby creating a third signal path from the input RF terminal to the output RF terminal without amplification, and
in a fourth gain state, the switching module is configured such that neither the first stage amplifier nor the second stage amplifier is bypassed.

20. A method of amplifying a radio frequency signal comprising:
providing a plurality of first stage amplifiers comprising at least one transistor of a first type;
providing a plurality of second stage amplifiers comprising at least one transistor of a second type;
connecting the plurality of second stage amplifier to a corresponding plurality of output loads:
arranging a first stage amplifier of the plurality of first stage amplifiers and a second stage amplifier of the plurality of second stage amplifiers in a folded configuration;
coupling the first stage amplifier and the second stage amplifier to a common power supply node;
coupling the first stage amplifier and the second stage amplifier to a common ground node;
applying an input RF signal to the first stage amplifier to generate an amplified signal at an output of the second stage RF amplifier, and
feeding the amplified signal to two or more output loads to generate corresponding two or more output signals at the same time.

21. The method of claim 20, wherein the first type the first type is N-type metal-oxide-semiconductor (NMOS) and the second type is P-type metal-oxide-semiconductor (PMOS).

22. The method of claim 20, further comprising bypassing selectively the first stage amplifier and/or the second stage amplifier to provide more than one amplifier gain.

23. The method of claim 20, wherein the first stage amplifier and/or the second stage amplifier comprise cascode amplifiers.

24. The method of claim 20, further comprising coupling the common power supply node to a voltage source through an RF choke.

* * * * *